(12) United States Patent
Liu et al.

(10) Patent No.: US 9,897,670 B2
(45) Date of Patent: Feb. 20, 2018

(54) MAGNETIC RESONANCE IMAGING SYSTEM AND COIL CONTROL DEVICE THEREOF

(71) Applicants: Yu Ye Liu, Shenzhen (CN); JianMin Wang, Shenzhen (CN)

(72) Inventors: Yu Ye Liu, Shenzhen (CN); JianMin Wang, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 566 days.

(21) Appl. No.: 14/499,920

(22) Filed: Sep. 29, 2014

(65) Prior Publication Data

US 2015/0091576 A1   Apr. 2, 2015

(30) Foreign Application Priority Data

Sep. 29, 2013  (CN) .......................... 2013 1 0454894

(51) Int. Cl.
  *G01V 3/00*   (2006.01)
  *G01R 33/36*  (2006.01)

(52) U.S. Cl.
  CPC ................................ *G01R 33/3657* (2013.01)

(58) Field of Classification Search
  CPC .. A61B 5/055; G01R 33/5608; G01R 33/543; G01R 33/385; G01R 33/5659
  USPC ........................................................ 324/322
  See application file for complete search history.

(56) References Cited

U.S. PATENT DOCUMENTS

| 5,552,695 A   | * | 9/1996 | Schwartz | ................. | G05F 1/40 323/271 |
| 2007/0217230 A1 | * | 9/2007 | Charles | .................... | H02J 1/102 363/20 |
| 2011/0012551 A1 | * | 1/2011 | Tseng | ..................... | H02J 7/0065 320/101 |
| 2012/0014138 A1 | * | 1/2012 | Ngo | .................. | H02M 3/33584 363/17 |
| 2013/0099788 A1 | * | 4/2013 | Xu | ...................... | H02M 3/3376 324/322 |

\* cited by examiner

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A coil control device of a magnetic resonance imaging system includes a DC-DC switching converter and a controller. The DC-DC switching converter is configured for switching and converting a DC power supply to a DC current or a DC voltage. An input end of the DC-DC switching converter is connected in parallel to the DC power supply. The controller is configured to control the DC-DC switching converter to switch and provide the DC current or the DC voltage. In some embodiments of the coil control device described herein, two power supplies (e.g., +15 V and −32 V) may be reduced to one power supply (e.g., +15 V), thereby saving energy and foregoing a water-cooling system.

18 Claims, 4 Drawing Sheets

MAGNETIC RESONANCE IMAGING SYSTEM AND COIL CONTROL DEVICE THEREOF

RELATED APPLICATIONS

This application claims the benefit of Chinese Patent Application No. CN 201310454894.7, filed Sep. 29, 2013. The entire contents of the priority document are hereby incorporated herein by reference.

TECHNICAL FIELD

The present teachings relate generally to magnetic resonance imaging (MRI) and, in some embodiments, to a coil of a MRI system and a coil control circuit of a MRI device.

BACKGROUND

Magnetic resonance imaging (MRI) is a technique using magnetic resonance phenomena for imaging. In magnetic resonance phenomena, a nucleus containing a single proton (e.g., the proton of a hydrogen nucleus prevalent in the human body) has a spinning movement similar to a small magnet. The spin axes of these small magnets do not follow a certain rule. If an external magnetic field is applied, these small magnets will be rearranged according to the magnetic force lines of the external magnetic field. For example, the small magnets may be arranged in two directions that are parallel or antiparallel to the magnetic force lines of the external magnetic field. The direction parallel to the magnetic force lines of the external magnetic field is called a positive longitudinal axis. The direction antiparallel to the magnetic force lines of the external magnetic field is called a negative longitudinal axis. The nucleus has only a longitudinal magnetization component, and the longitudinal magnetization component has both direction and amplitude. Nuclei in the external magnetic field may be excited by a radio-frequency (RF) pulse with a specific frequency to make the spin axes of the nuclei deviate from the positive longitudinal axis or the negative longitudinal axis, thereby producing resonance and giving rise to a magnetic resonance phenomenon. After the spin axes of the excited nuclei deviate from the positive longitudinal axis or the negative longitudinal axis, the nuclei have a transverse magnetization component. After stopping transmission of the radio-frequency pulse, the excited nuclei transmit echo signals to release the absorbed energy piecemeal in the form of electromagnetic waves. The phase and energy level of the electromagnetic waves both recover to the state prior to excitation. The image may be reconstructed after the echo signals transmitted by the nuclei are subjected to further processing (e.g., space encoding).

A magnetic resonance imaging system may operate with a number of various radio-frequency (RF) antennae (hereinafter, coils). A radio-frequency antenna is used to transmit and receive radio-frequency pulses so as to excite the atom nucleus to radiate magnetic resonance signals and/or to collect the induced magnetic resonance signals. The MRI system includes various coils, such as a body coil that covers the whole body area, a local coil that covers only a part of the body, or the like. The magnetic resonance system may have a large integrated coil (e.g., body coil) that is permanently fixed in a magnetic resonance scanner. The integrated coil may be arranged in a cylindrical manner around a patient sampling and collecting cavity (e.g., using a structure referred to as a nest configuration). In the patient sampling and collecting cavity, the patient is supported on a bed (e.g., a patient positioning table) during measurement. Since the coverage area of the body coil may be large, a higher transmitting power is used. The signal-to-noise ratio of an obtained image is relatively low, and the signal-to-noise ratio throughout the image is non-uniform. By contrast, the coverage area of a local coil may be small (e.g., the knee area covered by a knee coil, the head covered by a head coil, a wrist covered by a wrist coil, etc.). Thus, the local coil receives only limited radio-frequency signals within the radio-frequency excitation range. In order to distinguish the radio-frequency signals received by the local coil from the radio-frequency signals of the transmission stage, the radio-frequency signals received by the local coil are hereinafter referred to as magnetic resonance signals. The signal-to-noise ratio of an obtained image from a local coil may be high, and the signal-to-noise ratio throughout the image may be substantially uniform.

FIG. 1 shows a schematic diagram of a conventional coil control device of a magnetic resonance imaging system. In order to protect the security of the patient and the reliability of the coil itself, as shown in FIG. 1, the coil control device switches between a linear DC power supply (e.g., driven by a 15 V voltage $V_{CC}$) and a negative voltage $V_{SS}$ (e.g., −32 V) for control. However, there are too many energy losses associated with conventional designs. A load at one side of the coil is a diode. A sink current $I_{CS}$ passing through the diode is several hundreds of milliamperes with regard to the coil and several amperes with regard to the body coil. The energy loss produced from a control circuit may be obtained according to the following formula, $$P_{DISS} = I_{CS}(V_{CC} - V_F),$$

where $Y_F$ is a forward voltage passing through the diode (e.g., about 0.7 V). In this example, the energy loss rate may be shown by the following formula:

$$\eta = P_{DISS}/P_{TTL} * 100\% = I_{CS}(V_{CC} - V_F)/(I_{CS}V_{CC}) * 100\%,$$

where $P_{TTL}$ is the whole energy. In the example where $V_{CC}$ is 15 V and $V_F$ is 0.7 V, the energy loss rate η reaches 93.5%.

As shown above, in such a coil control circuit, most of the energy is wasted, thereby resulting in over-heating of the coil control circuit. As a result, a water-cooling system is used with the coil control circuit, thereby occupying space and increasing costs. In addition, the coil control circuit uses two power supplies that are positive and negative, thereby further increasing system complexity and costs.

SUMMARY AND DESCRIPTION

The scope of the present invention is defined solely by the appended claims, and is not affected to any degree by the statements within this summary.

The present embodiments may obviate one or more of the drawbacks or limitations in the related art. For example, in some embodiments, a coil control device of a magnetic resonance imaging system is provided that reduces system complexity and saves energy. The coil control device includes a DC-DC switching converter and a controller. The DC-DC switching converter is configured for switching and converting a DC power supply to a DC current or a DC voltage. An input end of the DC-DC switching converter is connected in parallel to the DC power supply. The controller is configured to control the DC-DC switching converter to switch and provide the DC current or the DC voltage.

The DC-DC switching converter includes a buck circuit and a buck-boost circuit. The buck circuit is configured for providing the DC current, and the buck-boost circuit is configured for providing the DC voltage.

The DC-DC switching converter includes a first switching switch, and the controller is configured to control the first switching switch to switch and disconnect the buck circuit and the buck-boost circuit.

The buck circuit is connected in series to the buck-boost circuit. The DC-DC switching converter includes a second switching switch, and the controller is configured to control the second switching switch to switch and short-out the buck circuit and the buck-boost circuit.

The controller includes a first feedback circuit and a second feedback circuit. The first feedback circuit is configured for extracting the DC current from the DC-DC switching converter. The second feedback circuit is configured for extracting the DC voltage from the DC-DC switching converter. When the buck circuit is in operation, the controller is configured to control the duty cycle of the buck circuit according to the DC current extracted by the first feedback circuit, so as to allow the DC current to be constant. When the buck-boost circuit is in operation, the controller is configured to control the duty cycle of the buck-boost circuit according to the DC voltage extracted by the second feedback circuit, so as to allow the DC voltage to be constant.

The larger the DC current provided by the first feedback circuit, the smaller that the duty cycle of the buck circuit is. The larger the DC voltage provided by the second feedback circuit, the smaller that the duty cycle of the buck-boost circuit is.

The DC-DC switching converter includes a first capacitor, a second capacitor, an inductor, a first switch, a second switch, a third switch, a fourth switch, a fifth switch, and a diode. The first capacitor, the second switch, the fourth switch, and the second capacitor are sequentially connected in parallel and one end is grounded. The first switch is connected in series between a non-grounding end of the first capacitor and a non-grounding end of the second switch. The inductor is connected in series between the non-grounding end of the second switch and a non-grounding end of the fourth switch. The third switch is connected in series between the non-grounding end of the second switch and a non-grounding end of the third switch. The diode and the fifth switch are bridged between the non-grounding end of the second switch and a non-grounding end of the second capacitor. The negative pole of the diode is connected to the non-grounding end of the second switch, and the positive pole of the diode is connected to a first end of the fifth switch. The second end of the fifth switch is connected to the non-grounding end of the second capacitor.

When the controller simultaneously controls the fourth switch and the fifth switch to stay open and the third switch to stay closed, and when the controller controls the first switch by using a first duty cycle signal and controls the second switch by using a second duty cycle signal, the DC-DC switching converter provides the DC current, wherein the first duty cycle signal and the second duty cycle signal are complementary. When the second switch and the third switch stay open and the fourth switch and the fifth switch simultaneously stay closed, and when the controller controls the first switch by using a third duty cycle signal, the DC-DC switching converter provides the DC voltage.

The controller includes a third feedback circuit and a fourth feedback circuit. The third feedback circuit is configured for extracting the DC current, and the fourth feedback circuit is configured for extracting the DC voltage. When the buck circuit is in operation, the controller controls the first duty cycle signal according to the DC current extracted by the third feedback circuit, so as to allow the DC current to stay constant. When the buck-boost circuit is in operation, the controller controls the third duty cycle signal according to the DC voltage extracted by the fourth feedback circuit, so as to allow the DC voltage to stay constant.

The larger the DC current provided by the third feedback circuit, the smaller that the duty cycle of the first duty cycle signal is. The larger the DC voltage provided by the fourth feedback circuit, the smaller that the duty cycle of the third duty cycle signal is.

The first duty cycle signal, the second duty cycle signal, and the third duty cycle signal are pulse width modulation signals.

The DC-DC switching converter includes a first capacitor, a second capacitor, an inductor, a first switch, a second switch, a third switch, a fourth switch, and a fifth switch. The first capacitor, the second switch, the fourth switch, and the second capacitor are sequentially connected in parallel and one end is grounded. The first switch is connected in series between a non-grounding end of the first capacitor and a non-grounding end of the second switch. The inductor is connected in series between the non-grounding end of the second switch and a non-grounding end of the fourth switch. The third switch is connected in series between the non-grounding end of the second switch and a non-grounding end of the third switch. The fifth switch and the sixth switch are bridged between the non-grounding end of the second switch and a non-grounding end of the second capacitor. An end of the fifth switch is connected to the non-grounding end of the second capacitor.

When the controller simultaneously controls the fourth switch and the fifth switch to stay open and the third switch to stay closed, and when the controller controls the first switch by using a fourth duty cycle signal and controls the second switch by using a fifth duty cycle signal, the DC-DC switching converter provides the DC current, wherein the fourth duty cycle signal and the fifth duty cycle signal are complementary. When the second switch and the third switch stay open and the fourth switch simultaneously stays closed, and when the controller controls the first switch by using a sixth duty cycle signal and controls the fifth switch by using a seventh duty cycle signal, the DC-DC switching converter provides the DC voltage, wherein the sixth duty cycle signal and the seventh duty cycle signal are complementary.

The controller includes a fifth feedback circuit and a sixth feedback circuit. The fifth feedback circuit is configured for extracting the DC current, and the sixth feedback circuit is configured for extracting the DC voltage. When the buck circuit is in operation, the controller controls the fourth duty cycle signal and the fifth duty cycle signal according to the DC current extracted by the third feedback circuit, so as to allow the DC current to stay constant. When the buck-boost circuit is in operation, the controller controls the sixth duty cycle signal and the seventh duty cycle signal according to the DC voltage extracted by the fourth feedback circuit, so as to allow the DC voltage to stay constant.

The larger the DC current provided by the fifth feedback circuit, the smaller that the duty cycle of the fourth duty cycle signal is. The larger the DC voltage provided by the fourth feedback circuit, the smaller that the duty cycle of the sixth duty cycle signal is.

The fourth duty cycle signal, the fifth duty cycle signal, the sixth duty cycle signal, and the seventh duty cycle signal are pulse width modulation signals.

A magnetic resonance imaging system includes any of the coil control devices of a magnetic resonance imaging system described above.

DETAILED DESCRIPTION

The present teachings will be further illustrated in conjunction with the accompanying drawings and representative embodiments. It should be understood that the embodiments described herein are merely illustrative rather than limiting.

In some embodiments, a coil control device of a magnetic resonance imaging system is provided. The coil control device includes a power supply, a DC-DC switching converter, and a controller. One end of the DC-DC switching converter is connected in parallel to the power supply. The other end of the DC-DC switching converter provides a constant current or a constant voltage. The controller controls the DC-DC switching converter to switch and provide the constant current or constant voltage. In some embodiments, the coil control device in accordance with the present teachings does not use a water-cooling system for heat dissipation, thereby saving energy substantially reducing system complexity.

Figure 1:
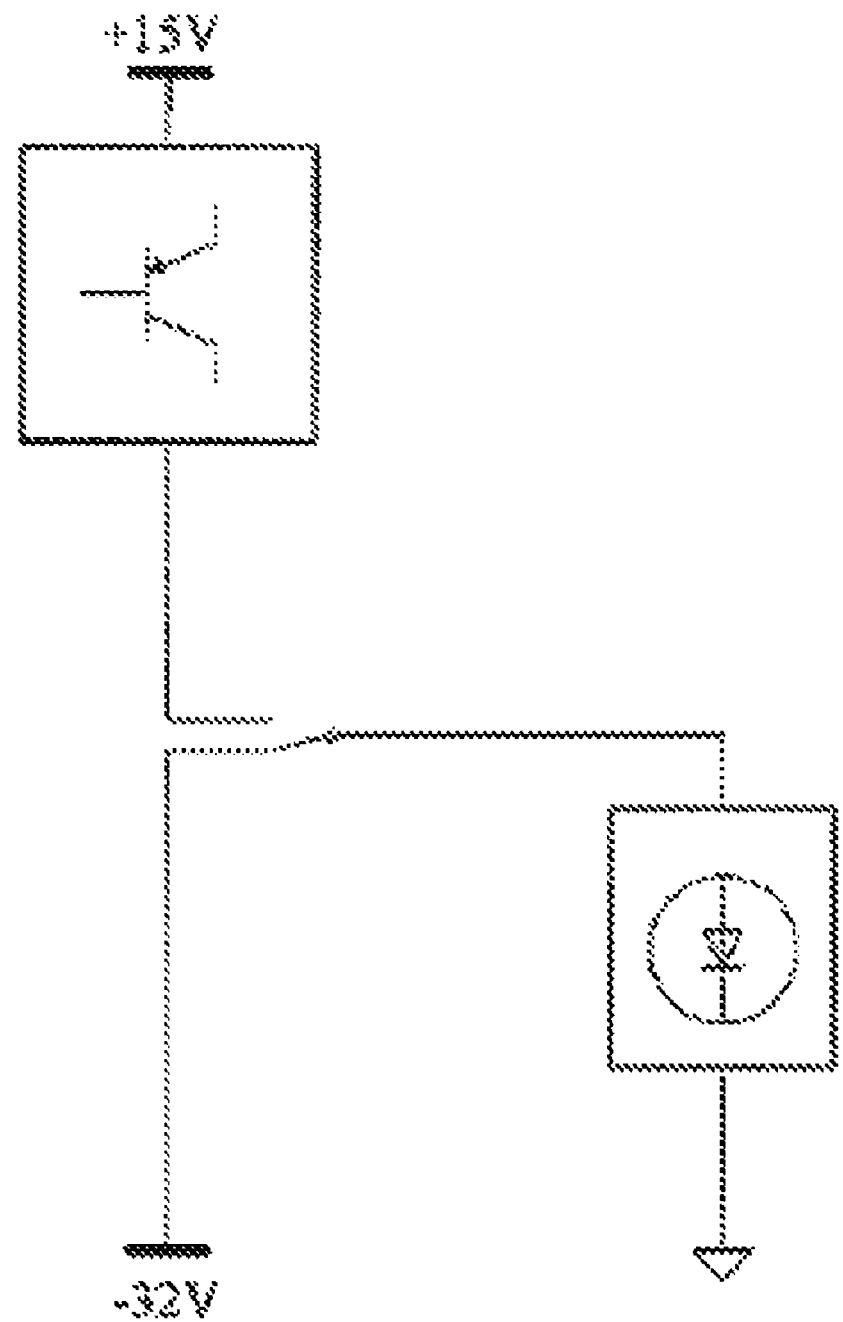
FIG. 1 shows a schematic diagram of a coil control device of a magnetic resonance imaging system.
Figure 2:
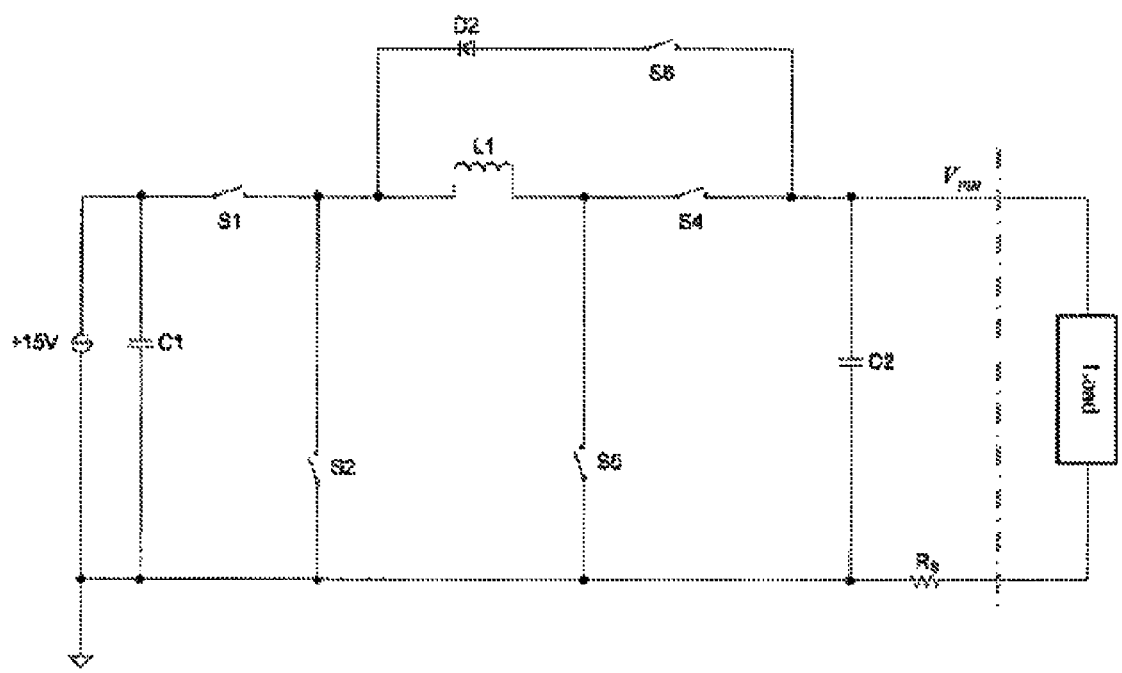
FIG. 2 shows a circuit diagram of an example of a first coil control device in accordance with the present teachings.

FIG. 2 shows a circuit diagram of an exemplary first coil control device in accordance with the present teachings. As shown in FIG. 2, the first coil control device includes a power supply, a DC-DC switching converter, and a controller. The power supply is a linear DC power supply of 15 V. The DC-DC switching converter has a first end connected in parallel to the power supply and a second end connected in parallel to a load (e.g., a coil). The controller is configured for controlling the working state (e.g., circuit topology form) of the DC-DC switching converter and for controlling the duty cycle of the DC-DC switching converter according to the current flowing through the load.

Figure 5:
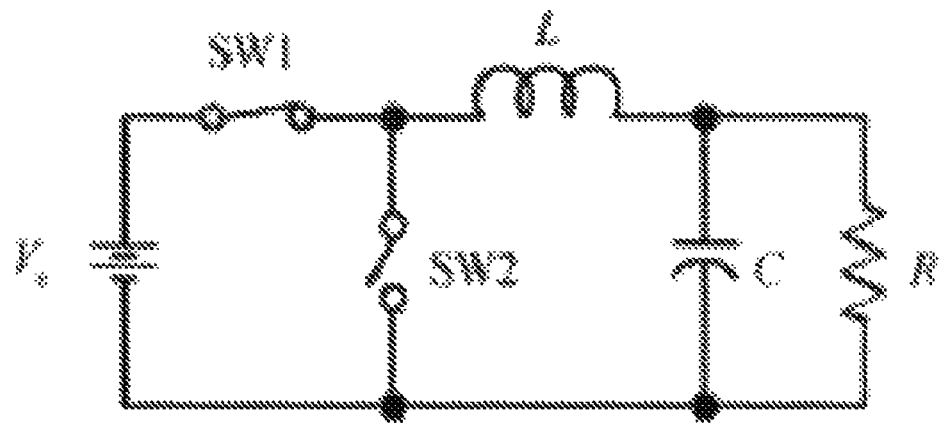
FIG. 5 shows a circuit diagram of a buck circuit of a DC-DC switching converter.
Figure 6:
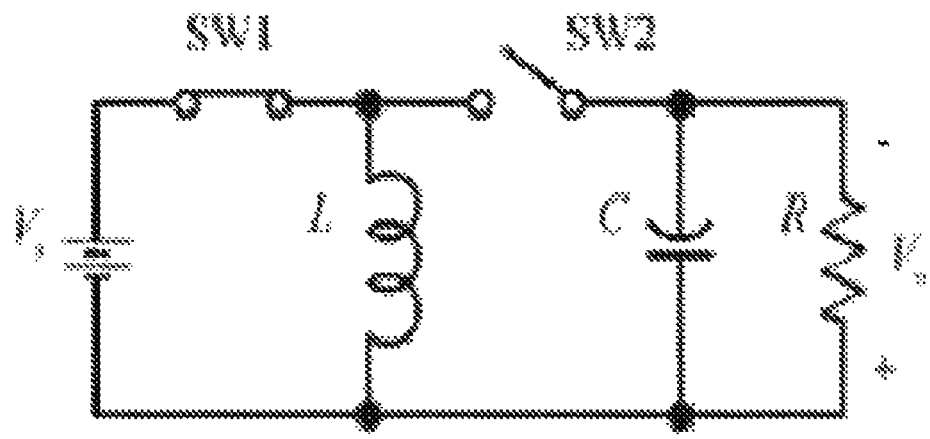
FIG. 6 shows a circuit diagram of a buck-boost circuit of a DC-DC switching converter.

FIG. 5 shows a circuit diagram of a buck circuit of a DC-DC switching converter. FIG. 6 shows a circuit diagram of a buck-boost circuit of a DC-DC switching converter. By way of background, two common circuit topology forms of the DC-DC switching converter are the buck circuit and the buck-boost circuit shown, respectively, in FIGS. 5 and 6. For a DC-DC switching converter of the buck-boost form, the polarity of the output voltage is opposite to the polarity of the input voltage. In addition, the amplitude of the output voltage may be higher than the amplitude of the input voltage or lower than the amplitude of the input voltage. The circuit structure is simple.

In some embodiments, as shown in FIG. 2, the DC-DC switching converter of a coil control device is a circuit integrating a buck circuit (e.g., buck topology form) with a buck-boost circuit (e.g., buck-boost topology form). For example, the DC-DC switching converter of a coil control device in accordance with the present teachings may include two working states: a buck circuit (e.g., buck topology form) and a buck-boost circuit (e.g., buck-boost topology form). As shown in FIG. 2, the DC-DC switching converter includes a first capacitor C1, a second capacitor C2, an inductor L1, a first switch S1, a second switch S2, a third switch S4, a fourth switch S5, a fifth switch S6, a diode D2, and a resistor Rs. The first capacitor C1, the second switch S2, the fourth switch S5, and the second capacitor C2 are sequentially connected in parallel and one end is grounded. The first switch S1 is connected in series between a non-grounding end of the first capacitor C1 and a non-grounding end of the second switch S2. The inductor L1 is connected in series between the non-grounding end of the second switch S2 and a non-grounding end of the fourth switch S5. The third switch S4 is connected in series between the non-grounding end of the second switch S2 and a non-grounding end of the fourth switch S5. The diode D2 and the fifth switch S6 are bridged between the non-grounding end of the second switch S2 and a non-grounding end of the second capacitor C2. The negative pole of the diode D2 is connected to the non-grounding end of the second switch S2. The positive pole of the diode D2 is connected to a first end of the fifth switch S6, and the second end of the fifth switch S6 is connected to the non-grounding end of the second capacitor C2. The first capacitor C1 and the second capacitor C2 are configured for ripple filtering. The first switch S1, the second switch S2, the third switch S4, the fourth switch S5, and the fifth switch S6 are controlled by the controller. The resistor Rs is configured for extracting a DC current Cs flowing through a load Load. As shown in FIG. 2, the load Load is a coil.

As described above, the controller of the first coil control device in accordance with the present teachings is configured for controlling the working state (e.g., circuit topology form) of the DC-DC switching converter. When the controller simultaneously controls the fourth switch and the fifth switch to stay open and the third switch to stay closed, and when the controller controls the first switch by using a first duty cycle signal and controls the second switch by using a second duty cycle signal, the DC-DC switching converter provides the DC current, wherein the first duty cycle signal and the second duty cycle signal are complementary.

Figure 3:
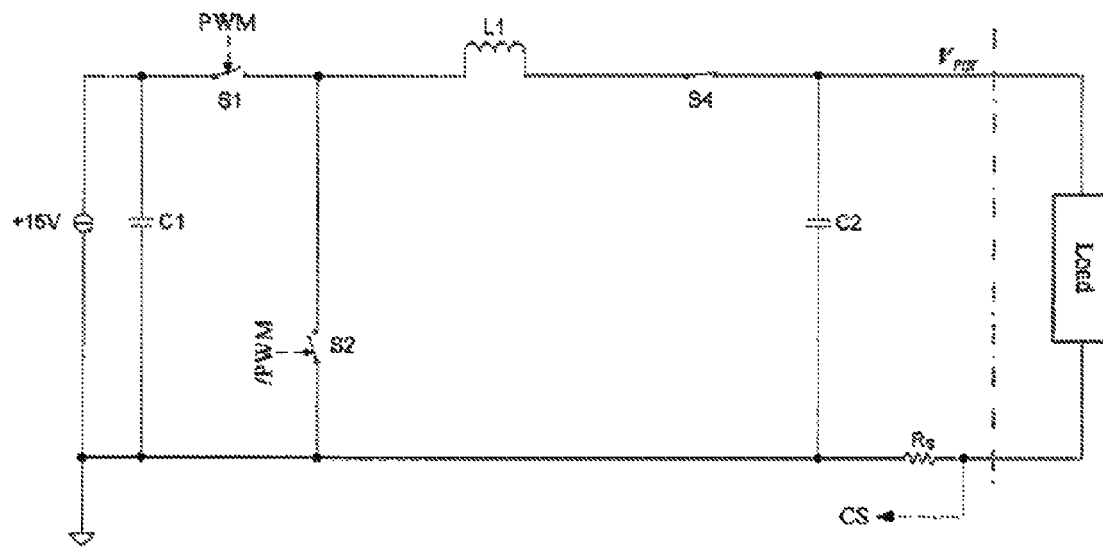
FIG. 3 shows an example of an equivalent circuit diagram of a first state of an exemplary first coil control device in accordance with the present teachings.

In some embodiments, when the coil uses constant DC power—for example, the DC-DC switching converter is in a constant-current mode (e.g., a first state)—the controller simultaneously controls the switches S5 and S6 to stay in an open state and the switch S4 to stay in a closed state. FIG. 3 shows an equivalent circuit diagram of a first state of a first coil control device in accordance with the present teachings. As shown in FIG. 3, when the first coil control device in accordance with the present teachings is in a first state, the DC-DC switching converter is equivalent to a buck circuit, as shown in FIGS. 3 and 5. When the switch S1 (SW1) is closed and S2 (SW2) is open, the current of the inductor L1 (L) increases, and the inductor L1 (L) stores energy. When the switch S1 (SW1) is open and S2 (SW2) is closed, the current of the inductor L1 (L) decreases, and the inductor L1 (L) releases energy. Within an open/close period, if the current increment is greater than the current decrement, then an average induced electromotive force will be generated. This average induced electromotive force will decrease the increasing speed of the induced current while reducing the decreasing speed of the induced current, eventually resulting in the average increment of the induced current within a period being zero. Within an open/close period, the same result will occur if the current increment is smaller than the current decrement. Therefore, when the first coil control device in accordance with the present teachings is in a first state (e.g., the DC-DC switching converter is equivalent to a buck circuit), the first coil control device provides constant DC power for the coil.

The controller includes a third feedback circuit. The third feedback circuit is configured for extracting the DC current. When the buck circuit is in operation, the controller controls the first duty cycle signal according to the DC current provided by the third feedback circuit, so as to allow the DC current to stay constant. The larger the DC current provided by the third feedback circuit, the smaller that the duty cycle of the first duty cycle signal is.

In some embodiments, the controller of the DC-DC switching converter of the first coil control device in accordance with the present teachings further includes a third feedback circuit. The third feedback circuit is configured for providing the DC current (e.g., the resistor Rs is configured for extracting the DC current Cs flowing through the load Load). When the buck circuit is in operation, the controller controls the first switch S1 by using a first duty cycle signal and controls the second switch S2 by using a second duty cycle signal according to the DC current provided by the third feedback circuit so as to keep the DC current constant. The first duty cycle signal and the second duty cycle signal are complementary. In some embodiments, the controller of the first coil control device in accordance with the present teachings respectively controls the opening/closing of the switches S1 and S2 based on the fact that the controller uses a pair of complementary pulse width modulation (PWM) signals (e.g., the first duty cycle signal and the second duty cycle signal) according to the DC current provided by the third feedback circuit. The first state of the first coil control device in accordance with the present teachings differs from the buck circuit of a conventional DC-DC switching converter in the voltage at two ends of the load Load. The output voltage of the buck circuit of a conventional DC-DC switching converter is unchanged (e.g., the voltage at two ends of the load Load is unchanged or, in other words, the complementary duty cycles of the first switch S1 and the second switch S2 are unchanged). However, the output voltage $V_{PIN}$ of the first state of the first coil control device in accordance with the present teachings is not constant and unchanged (e.g., the voltage at two ends of the load Load changes with the load Load or, in other words, the complementary duty cycles of the first switch S1 and the second switch S2 change). The controller of the first coil control device in accordance with the present teachings allows the output current Cs to stay constant based on the control of the output voltage $V_{PIN}$ of the first state. For example, the duty cycle of the first switch S1 (e.g., the output voltage $V_{PIN}$ of the first state of the first coil control device in accordance with the present teachings) is directly proportional to the load Load.

In some embodiments, when the first switch S1 is closed and the second switch S2 is open (e.g., in an open state), the current of the inductor L1 increases linearly, while the current Cs flowing through the load Load is provided by the second capacitor C2 and the DC power supply. The duty cycle of the first duty cycle signal controlled by the controller equals the ratio of the time period when the first switch S1 is in a closed state to the whole open/close period, which equals 1—the duty cycle of the second duty cycle signal controlled by the controller, which equals the ratio of the time period when the second switch S2 is in an open state to the whole open/close period.

When the first switch S1 is open and the second switch S2 is closed (e.g., in a closed state), the current of the inductor L1 decreases, and the current of the inductor L1 simultaneously provides the current of the second capacitor C2 and the DC current Cs flowing through the load Load. There are only two states of the DC-DC switching converter in the whole open/close period. Therefore, the ratio of the time period when the first switch S1 is in an open state to the whole open/close period equals 1—the duty cycle of the first duty cycle signal controlled by the controller, which equals the duty cycle of the second duty cycle signal controlled by the controller, which equals the ratio of the time period when the second switch S2 is in a closed state to the whole open/close period.

In steady-state conditions, the current increment in the open state is equal to the current decrement in the closed state. Therefore, according to the "voltage-second product balance" principle, the DC current is in a direct proportional relationship with the duty cycle. Thus, the larger the duty cycle, the larger that the DC current thereof is. Conversely, the smaller the duty cycle, the smaller that the DC current thereof is. Therefore, the third feedback circuit provides negative feedback. For example, the duty cycle of the first switch S1 controlled by the controller is inversely proportional to the DC current provided by the third feedback circuit, so as to allow the DC current to stay constant.

As stated above, the controller of the first coil control device in accordance with the present teachings is configured for controlling the working state (e.g., circuit topology form) of the DC-DC switching converter. When the controller simultaneously controls the second switch and the third switch to stay open and the fourth switch and the fifth switch to stay closed, and the controller controls the first switch by using a third duty cycle signal, the DC-DC switching converter provides the DC voltage.

Figure 4:
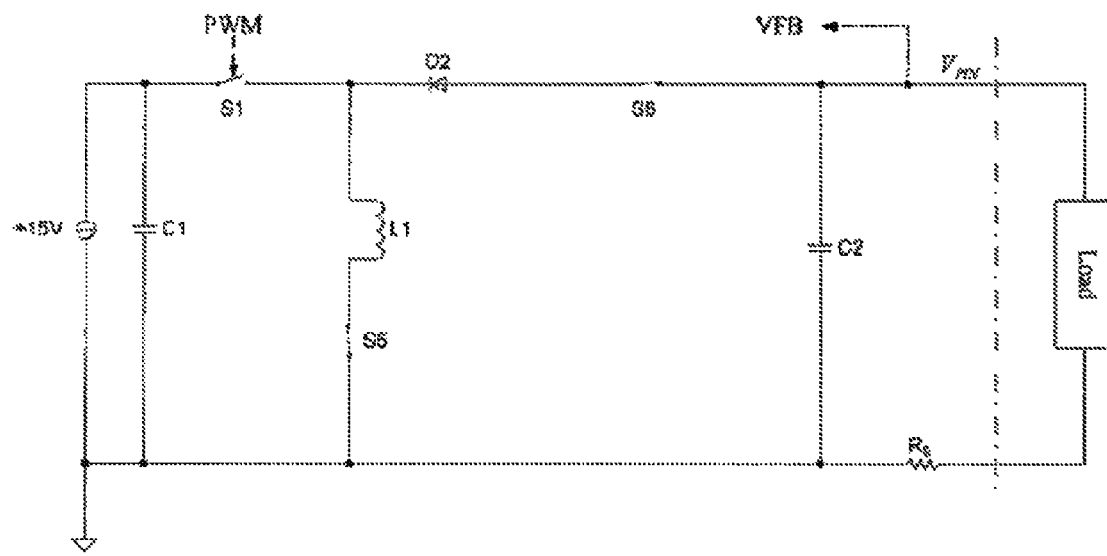
FIG. 4 shows an example of an equivalent circuit diagram of a second state of an exemplary first coil control device in accordance with the present teachings.

In some embodiments, when the coil uses a constant negative voltage—for example, the DC-DC switching converter is in a negative voltage mode (e.g., a second state)—the controller simultaneously controls the switches S2 and S4 to stay in an open state and the switches S5 and S6 to stay in a closed state. FIG. 4 is an equivalent circuit diagram of a second state of a first coil control device in accordance with the present teachings. As shown in FIG. 4, when the first coil control device in accordance with the present teachings is in a second state, the DC-DC switching converter is equivalent to a buck-boost circuit, as shown in FIGS. 4 and 6, wherein the diode D2 is equivalent to the switch SW2. When the first switch S1 (SW1) is closed and the diode D2 is cut off (SW2 is open), the current of the inductor L1 (L) increases, and the inductor L1 (L) stores energy. When the first switch S1 (SW1) is open and the diode D2 is conducting (SW2 is closed), the current of the inductor L1 (L) decreases, and the inductor L1 (L) releases energy. Within an open/close period, if the current increment is greater than the current decrement, then an average induced electromotive force will be generated. This average induced electromotive force will decrease the increasing speed of the induced current while reducing the decreasing speed of the induced current, eventually resulting in the average increment of the induced current within a period being zero. Within an open/close period, the same result will occur if the current increment is smaller than the current decrement. Therefore, when the first coil control device in accordance with the present teachings is in a first state (e.g., the DC-DC switching converter is equivalent to a buck-boost circuit), the first coil control device in accordance with the present teachings provides a constant negative voltage for the coil.

The controller further includes a fourth feedback circuit. The fourth feedback circuit is configured for extracting the DC voltage. When the buck-boost circuit is in operation, the controller controls the third duty cycle signal according to the DC voltage extracted by the fourth feedback circuit, so as to allow the DC voltage to stay constant. The larger the DC voltage provided by the fourth feedback circuit, the smaller that the duty cycle of the third duty cycle signal is.

The controller of the DC-DC switching converter of the first coil control device in accordance with the present teachings further includes a fourth feedback circuit. The fourth feedback circuit is configured for providing the DC voltage (e.g., a DC voltage VFB). When the buck-boost circuit is in operation, the controller controls the third duty cycle signal (e.g., a switch controlling the first switch S1) according to the DC voltage extracted by the fourth feedback circuit, so as to allow the DC voltage to stay constant. In some embodiments, the controller of the first coil control device in accordance with the present teachings controls the opening/closing of the first switch S1 based on the fact that the controller uses a pulse width modulation (PWM) signal (e.g., the third duty cycle signal) according to the DC voltage provided by the fourth feedback circuit. The pulse width modulation signal (e.g., the third duty cycle signal) described above may be determined according to a feedback signal (e.g., the voltage VFB). The first state of the first coil control device in accordance with the present teachings is substantively the same as the buck-boost circuit of the DC-DC switching converter. However, the first state of the first coil control device in accordance with the present teachings differs from the buck-boost circuit of a conventional DC-DC switching converter in the voltage at two ends of the load Load. The output voltage of the buck-boost circuit of a conventional DC-DC switching converter is unchanged. For example, the voltage at two ends of the load Load is unchanged (e.g., the duty cycle of S1 is unchanged). However, the output voltage VFB of the first state of the first coil control device in accordance with the present teachings is not constant and unchanged (e.g., the voltage at two ends of the load Load changes or, in other words, the duty cycle of the first switch S1 changes). The output voltage VFB of the first state of the first coil control device in accordance with the present teachings changes by controlling the duty cycle of S1, so as to allow the VFB itself to stay constant. For example, the VFB provides negative feedback for the controller of the first coil control device in accordance with the present teachings so as to regulate and control the PWM signal of the switch S1, thereby allowing the VFB to stay constant.

In some embodiments, when the first switch S1 is closed and the diode D2 is cut off (e.g., in an open state), a voltage of +15 V of the DC power supply is directly loaded at two ends of the inductor L1. Therefore, the current of the inductor L1 increases linearly, while the current Cs flowing through the load Load is provided by the second capacitor C2. The duty cycle of the third duty cycle signal controlled by the controller equals the ratio of the time period when the first switch S1 is in a closed state to the whole open/close period.

When the first switch S1 is open and the diode D2 is conducting (e.g., in a closed state), the current of the inductor L1 decreases. The polarity of the voltage at two ends of the inductor L1 reverses, and the current thereof simultaneously provides the current of the second capacitor C2 and the current Cs flowing through the load Load. According to the direction of flow of the current, it may be determined that the output voltage is negative (e.g., opposite to the polarity of the input voltage). Since the output voltage is negative, the inductor current is reductive. Thus, since the loaded voltage is a constant, the inductor current linearly decreases. There are only two states of the DC-DC switching converter in the whole open/close period. Therefore, the ratio of the time period when the first switch S1 is in an open state to the whole open/close period equals 1—the duty cycle of the third duty cycle signal controlled by the controller.

In steady-state conditions, the current increment in the open state is equal to the current decrement in the closed state. Therefore, according to the "voltage-second product balance" principle, the DC voltage is in a direct proportional relationship with the duty cycle. The larger the duty cycle is, the larger that the DC voltage thereof is. Conversely, the smaller the duty cycle, the smaller that the DC voltage thereof is. Therefore, the fourth feedback circuit provides negative feedback (e.g., the duty cycle of the first switch S1 controlled by the controller is inversely proportional to the DC voltage provided by the fourth feedback circuit, so as to allow the DC voltage to stay constant).

The controller of the first coil control device in accordance with the present teachings may be implemented in a plurality of ways, including through hardware, software and a combination of software and hardware (e.g., a circuit, a chip, a programmable device), to provide a corresponding pulse width modulation signal according to the DC current extracted by the third feedback circuit and the DC voltage extracted by the fourth feedback circuit (e.g., a first duty cycle signal, a second duty cycle signal, and a third duty cycle signal).

A DC-DC switching converter of a second coil control device in accordance with the present teachings may also be achieved using various other circuits. For example, a first exemplary circuit that may be used is a buck circuit connected in parallel to a buck-boost circuit. In some embodiments, the DC-DC switching converter includes a first switching switch, wherein the first switching switch controls the buck-boost circuit to be an open circuit when the buck circuit is in operation, or controls the buck circuit to be an open circuit when the buck-boost circuit is in operation. A second exemplary circuit that may be used is a buck circuit connected in series to a buck-boost circuit. In some embodiments, the DC-DC switching converter includes a second switching switch, wherein the second switching switch controls the buck-boost circuit to be short-circuited when the buck circuit is in operation, or controls the buck circuit to be short-circuited when the buck-boost circuit is in operation.

The controller of the DC-DC switching converter of the second coil control device in accordance with the present teachings includes a first feedback circuit and a second feedback circuit. The first feedback circuit is configured for providing the DC current (e.g., a resistor Rs is configured for extracting a DC current Cs flowing through a load Load). The second feedback circuit is configured for providing the DC voltage (e.g., a DC voltage VFB). When the buck circuit is in operation, the controller controls the duty cycle of the buck circuit according to the DC current provided by the first feedback circuit, so as to keep the DC current constant. When the buck-boost circuit is in operation, the controller controls the duty cycle of the buck-boost circuit according to the DC voltage provided by the second feedback circuit, so as to keep the DC voltage constant. In some embodiments, the first feedback circuit and the second feedback circuit provide negative feedback. For example, the larger the DC current provided by the first feedback circuit, the smaller the duty cycle of the buck circuit is. In addition, the smaller the duty cycle of the first switch SW1 controlled by the controller, the larger that the duty cycle of the second switch SW2 is. Furthermore, the larger the DC voltage provided by the second feedback circuit, the smaller that the duty cycle of the buck-boost circuit is. In addition, the smaller the duty cycle of the first switch SW1 controlled by the controller, the larger that the duty cycle of the second switch SW2 is.

The DC-DC switching converter of a third coil control device in accordance with the present teachings includes a first capacitor, a second capacitor, an inductor, a first switch, a second switch, a third switch, a fourth switch, and a fifth switch. The first capacitor, the second switch, the fourth switch, and the second capacitor are sequentially connected in parallel and one end is grounded. The first switch is connected in series between a non-grounding end of the first capacitor and a non-grounding end of the second switch. The inductor is connected in series between the non-grounding end of the second switch and a non-grounding end of the fourth switch. The third switch is connected in series between the non-grounding end of the second switch and a non-grounding end of the third switch. The fifth switch and the sixth switch are bridged between the non-grounding end of the second switch and a non-grounding end of the second capacitor, and an end of the fifth switch is connected to the non-grounding end of the second capacitor.

When the controller simultaneously controls the fourth switch and the fifth switch to stay open and the third switch to stay closed, and the controller controls the first switch by using a fourth duty cycle signal and controls the second switch by using a fifth duty cycle signal, the DC-DC switching converter provides the DC current. The fourth duty cycle signal and the fifth duty cycle signal are complementary. When the second switch and the third switch stay open and the fourth switch simultaneously stays closed, and when the controller controls the first switch by using a sixth duty cycle signal and controls the fifth switch by using a seventh duty cycle signal, the DC-DC switching converter provides the DC voltage. The sixth duty cycle signal and the seventh duty cycle signal are complementary.

The fourth duty cycle signal, the fifth duty cycle signal, the sixth duty cycle signal, and the seventh duty cycle signal are pulse width modulation signals.

The controller includes a fifth feedback circuit and a sixth feedback circuit. The fifth feedback circuit is configured for extracting the DC current, and the sixth feedback circuit is configured for extracting the DC voltage. When the buck circuit is in operation, the controller controls the fourth duty cycle signal and the fifth duty cycle signal according to the DC current extracted by the third feedback circuit, so as to allow the DC current to stay constant. When the buck-boost circuit is in operation, the controller controls the sixth duty cycle signal and the seventh duty cycle signal according to the DC voltage extracted by the fourth feedback circuit, so as to allow the DC voltage to stay constant.

The larger the DC current provided by the fifth feedback circuit, the smaller the duty cycle of the fourth duty cycle signal is. The larger the DC voltage provided by the fourth feedback circuit, the smaller the duty cycle of the sixth duty cycle signal is.

The two states of a coil control device in accordance with the present teachings are in an alternate working state. Thus, the energy loss resulting from the DC-DC switching converter of a coil control device in accordance with the present teachings is substantially smaller than the energy loss of a circuit with two power supplies. Therefore, a coil control device in accordance with the present teachings does not require a water-cooling system. In summary, advantages of a coil control device in accordance with the present teachings may include one or more of the following. First, two power supplies (e.g., +15 V and −32 V) may be reduced to one power supply (e.g., +15 V), thereby saving energy. Second, a water-cooling system may not be required, thereby further saving energy.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding claim—whether independent or dependent—and that such new combinations are to be understood as forming a part of the present specification.

The invention claimed is:

1. A coil control device of a magnetic resonance imaging system, the coil control device comprising:
   a DC-DC switching converter comprising a first capacitor, a second capacitor, an inductor, a first switch, a second switch, a third switch, a fourth switch, a fifth switch, and a diode, wherein the first capacitor, the second switch, the fourth switch, and the second capacitor are sequentially connected in parallel, and one end of the parallel connection is grounded, wherein the first switch is connected in series between a non-grounding end of the first capacitor and a non-grounding end of the second switch, wherein the inductor is connected in series between the non-grounding end of the second switch and a non-grounding end of the fourth switch, wherein the third switch is connected in series between the non-grounding end of the second capacitor and a non-grounding end of the fourth switch, wherein the diode and the fifth switch are bridged between the non-grounding end of the second switch and a non-grounding end of the second capacitor, wherein a negative pole of the diode is connected to the non-grounding end of the second switch, wherein a positive pole of the diode is connected to a first end of the fifth switch, and wherein a second end of the fifth switch is connected to the non-grounding end of the second capacitor; and
   a controller;
   wherein the DC-DC switching converter is configured for switching and converting a DC power supply to a DC current or a DC voltage,
   wherein an input end of the DC-DC switching converter is connected in parallel to the DC power supply,
   wherein the controller is configured to control the DC-DC switching converter to switch and provide the DC current or the DC voltage,
   wherein the DC-DC switching converter provides the DC current, wherein a first duty cycle signal and a second duty cycle signal are complementary, when (a) the controller simultaneously controls the fourth switch and the fifth switch to stay open and the third switch to stay closed, and (b) the controller controls the first switch by using the first duty cycle signal and controls the second switch by using the second duty cycle signal, and wherein the DC-DC switching converter provides the DC voltage when (a) the second switch and the third switch stay open and the fourth switch and the fifth switch simultaneously stay closed, and (b) the controller controls the first switch by using a third duty cycle.

2. The coil control device of claim 1, wherein the DC-DC switching converter comprises:
a buck circuit; and
a buck-boost circuit;
wherein the buck circuit is configured for providing the DC current, and wherein the buck-boost circuit is configured for providing the DC voltage.

3. The coil control device of claim 2, wherein:
the buck circuit is connected in parallel to the buck-boost circuit;
wherein the DC-DC switching converter comprises a first switching switch; and
wherein the controller is configured to control the first switching switch to switch and disconnect the buck circuit and the buck-boost circuit.

4. The coil control device of claim 2, wherein:
the buck circuit is connected in series to the buck-boost circuit;
wherein the DC-DC switching converter comprises a second switching switch; and
wherein the controller is configured to control the second switching switch to switch and short-out the buck circuit and the buck-boost circuit.

5. The coil control device of claim 2, wherein:
the controller comprises a first feedback circuit and a second feedback circuit;
wherein the first feedback circuit is configured for extracting the DC current from the DC-DC switching converter;
wherein the second feedback circuit is configured for extracting the DC voltage from the DC-DC switching converter;
wherein, when the buck circuit is in operation, the controller is configured to control a duty cycle of the buck circuit according to the DC current extracted by the first feedback circuit, such that the DC current is constant; and
wherein, when the buck-boost circuit is in operation, the controller is configured to control a duty cycle of the buck-boost circuit according to the DC voltage extracted by the second feedback circuit, such that the DC voltage is constant.

6. The coil control device of claim 5, wherein:
the DC current provided by the first feedback circuit is inversely proportional to the duty cycle of the buck circuit; and
wherein the DC voltage provided by the second feedback circuit is inversely proportional to the duty cycle of the buck-boost circuit.

7. The coil control device of claim 1, wherein:
the controller comprises a third feedback circuit and a fourth feedback circuit;
wherein the third feedback circuit is configured for extracting the DC current, and the fourth feedback circuit is configured for extracting the DC voltage;
wherein, when a buck circuit is in operation, the controller controls the first duty cycle signal according to the DC current extracted by the third feedback circuit, such that the DC current stays constant; and wherein, when a buck-boost circuit is in operation, the controller controls the third duty cycle signal according to the DC voltage extracted by the fourth feedback circuit, such that the DC voltage stays constant.

8. The coil control device of claim 7, wherein:
the DC current provided by the third feedback circuit is inversely proportional to a duty cycle of the first duty cycle signal; and
wherein the DC voltage provided by the fourth feedback circuit is inversely proportional to a duty cycle of the third duty cycle signal.

9. The coil control device of claim 1, wherein each of the first duty cycle signal, the second duty cycle signal, and the third duty cycle signal comprises a pulse width modulation signal.

10. A magnetic resonance imaging system comprising:
a coil control device of the magnetic resonance imaging system, the coil control device comprising:
a DC-DC switching converter comprising a first capacitor, a second capacitor, an inductor, a first switch, a second switch, a third switch, a fourth switch, a fifth switch, and a diode,
wherein the first capacitor, the second switch, the fourth switch, and the second capacitor are sequentially connected in parallel, and one end of the parallel connection is grounded, wherein the first switch is connected in series between a non-grounding end of the first capacitor and a non-grounding end of the second switch, wherein the inductor is connected in series between the non-grounding end of the second switch and a non-grounding end of the fourth switch, wherein the third switch is connected in series between the non-grounding end of the second capacitor and a non-grounding end of the fourth switch, wherein the diode and the fifth switch are bridged between the non-grounding end of the second switch and a non-grounding end of the second capacitor, wherein a negative pole of the diode is connected to the non-grounding end of the second switch, wherein a positive pole of the diode is connected to a first end of the fifth switch, and wherein a second end of the fifth switch is connected to the non-grounding end of the second capacitor; and
a controller;
wherein the DC-DC switching converter is configured for switching and converting a DC power supply to a DC current or a DC voltage,
wherein an input end of the DC-DC switching converter is connected in parallel to the DC power supply,
wherein the controller is configured to control the DC-DC switching converter to switch and provide the DC current or the DC voltage,
wherein the DC-DC switching converter provides the DC current, wherein a first duty cycle signal and a second duty cycle signal are complementary, when (a) the controller simultaneously controls the fourth switch and the fifth switch to stay open and the third switch to stay closed, and (b) the controller controls the first switch by using the first duty cycle signal and controls the second switch by using the second duty cycle signal, and
wherein the DC-DC switching converter provides the DC voltage when (a) the second switch and the third switch stay open and the fourth switch and the fifth switch simultaneously stay closed, and (b) the controller controls the first switch by using a third duty cycle.

11. The magnetic resonance imaging system of claim 10 wherein the DC-DC switching converter comprises:
a buck circuit; and
a buck-boost circuit;
wherein the buck circuit is configured for providing the DC current, and wherein the buck-boost circuit is configured for providing the DC voltage.

12. The magnetic resonance imaging system of claim 11 wherein:
the buck circuit is connected in parallel to the buck-boost circuit;
wherein the DC-DC switching converter comprises a first switching switch; and
wherein the controller is configured to control the first switching switch to switch and disconnect the buck circuit and the buck-boost circuit.

13. The magnetic resonance imaging system of claim 11 wherein:
the buck circuit is connected in series to the buck-boost circuit;
wherein the DC-DC switching converter comprises a second switching switch; and
wherein the controller is configured to control the second switching switch to switch and short-out the buck circuit and the buck-boost circuit.

14. A coil control device of a magnetic resonance imaging system, the coil control device comprising:
a DC-DC switching converter comprising a first capacitor, a second capacitor, an inductor, a first switch, a second switch, a third switch, a fourth switch, and a fifth switch, wherein the first capacitor, the second switch, the fourth switch, and the second capacitor are sequentially connected in parallel, and one end of the parallel connection is grounded, wherein the first switch is connected in series between a non-grounding end of the first capacitor and a non-grounding end of the second switch, wherein the inductor is connected in series between the non-grounding end of the second switch and a non-grounding end of the fourth switch, wherein the third switch is connected in series between the non-grounding end of the second capacitor and a non-grounding end of the fourth switch, wherein the fifth switch is bridged between the non-grounding end of the second switch and a non-grounding end of the second capacitor, and wherein an end of the fifth switch is connected to the non-grounding end of the second capacitor; and
a controller,
wherein the DC-DC switching converter is configured for switching and converting a DC power supply to a DC current or a DC voltage,
wherein an input end of the DC-DC switching converter is connected in parallel to the DC power supply,
wherein the controller is configured to control the DC-DC switching converter to switch and provide the DC current or the DC voltage,
wherein the DC-DC switching converter provides the DC current, wherein a first duty cycle signal and a second duty cycle signal are complementary, when (a) the controller simultaneously controls the fourth switch and the fifth switch to stay open and the third switch to stay closed, and (b) the controller controls the first switch by using the first duty cycle signal and controls the second switch by using the second duty cycle signal, and
wherein the DC-DC switching converter provides the DC voltage, wherein a third duty cycle signal and a fourth duty cycle signal are complementary, when (a) the second switch and the third switch stay open and the fourth switch simultaneously stays closed, and (b) the controller controls the first switch by using the third duty cycle signal and controls the fifth switch by using the fourth duty cycle signal.

15. The coil control device of claim 14, wherein:
the controller comprises a fifth feedback circuit and a sixth feedback circuit;
wherein the fifth feedback circuit is configured for extracting the DC current, and the sixth feedback circuit is configured for extracting the DC voltage;
wherein, when a buck circuit is in operation, the controller controls the fourth duty cycle signal and the fifth duty cycle signal according to the DC current extracted by the third feedback circuit, such that the DC current stays constant; and
wherein, when a buck-boost circuit is in operation, the controller controls the sixth duty cycle signal and the seventh duty cycle signal according to the DC voltage extracted by the fourth feedback circuit, such that the DC voltage stays constant.

16. The coil control device of claim 15, wherein:
the DC current provided by the fifth feedback circuit is inversely proportional to a duty cycle of the fourth duty cycle signal; and
wherein the DC voltage provided by the fourth feedback circuit is inversely proportional to a duty cycle of the sixth duty cycle.

17. The coil control device of claim 14, wherein each of the fourth duty cycle signal, the fifth duty cycle signal, the sixth duty cycle signal, and the seventh duty cycle signal comprises a pulse width modulation signal.

18. A magnetic resonance imaging system comprising:
a coil control device of the magnetic resonance imaging system, the coil control device comprising:
a DC-DC switching converter comprising a first capacitor, a second capacitor, an inductor, a first switch, a second switch, a third switch, a fourth switch, and a fifth switch, wherein the first capacitor, the second switch, the fourth switch, and the second capacitor are sequentially connected in parallel, and one end of the parallel connection is grounded, wherein the first switch is connected in series between a non-grounding end of the first capacitor and a non-grounding end of the second switch, wherein the inductor is connected in series between the non-grounding end of the second switch and a non-grounding end of the fourth switch, wherein the third switch is connected in series between the non-grounding end of the second capacitor and a non-grounding end of the fourth switch, wherein the fifth switch is bridged between the non-grounding end of the second switch and a non-grounding end of the second capacitor, and wherein an end of the fifth switch is connected to the non-grounding end of the second capacitor; and
a controller,
wherein the DC-DC switching converter is configured for switching and converting a DC power supply to a DC current or a DC voltage,
wherein an input end of the DC-DC switching converter is connected in parallel to the DC power supply,
wherein the controller is configured to control the DC-DC switching converter to switch and provide the DC current or the DC voltage, wherein the DC-DC switching converter provides the DC current, wherein a first duty cycle signal and a second duty cycle signal are complementary, when (a) the controller simultaneously controls the fourth switch and the fifth switch to stay open and the third switch to stay closed, and (b) the controller controls the first switch by using the first duty cycle signal and controls the second switch by using the second duty cycle signal, and wherein the DC-DC switching converter provides the DC voltage, wherein a third duty cycle signal and a fourth duty cycle signal are complementary, when (a) the second switch and the third switch stay open and the fourth switch simultaneously stays closed, and (b) the controller controls the first switch by using the third duty cycle signal and controls the fifth switch by using the fourth duty cycle signal.

\* \* \* \* \*